United States Patent
Yang et al.

(10) Patent No.: US 11,289,645 B2
(45) Date of Patent: Mar. 29, 2022

(54) METHOD TO INTEGRATE MRAM DEVICES TO THE INTERCONNECTS OF 30NM AND BEYOND CMOS TECHNOLOGIES

(71) Applicant: Headway Technologies, Inc., Milpitas, CA (US)

(72) Inventors: Yi Yang, Fremont, CA (US); Vignesh Sundar, Fremont, CA (US); Dongna Shen, San Jose, CA (US); Sahil Patel, Fremont, CA (US); Ru-Ying Tong, Los Gatos, CA (US); Yu-Jen Wang, San Jose, CA (US)

(73) Assignee: Headway Technologies, Inc., Milpitas, CA (US)

(*) Notice: Subject to any disclaimer, the term of this patent is extended or adjusted under 35 U.S.C. 154(b) by 0 days.

(21) Appl. No.: 16/236,705

(22) Filed: Dec. 31, 2018

(65) Prior Publication Data

US 2020/0212297 A1    Jul. 2, 2020

(51) Int. Cl.
*H01L 43/12*    (2006.01)
*H01L 27/22*    (2006.01)
*H01L 43/02*    (2006.01)

(52) U.S. Cl.
CPC ............ *H01L 43/12* (2013.01); *H01L 27/222* (2013.01); *H01L 43/02* (2013.01)

(58) Field of Classification Search
CPC ....... H01L 41/06; H01L 41/12; H01L 41/125; H01L 41/20; H01L 41/47; H01L 27/20; H01L 43/12; H01L 43/02; H01L 27/222–228; H01L 43/00–14; H01L 43/08; G11C 11/15; G11C 19/08; G11C 14/0036; G11C 14/0081
See application file for complete search history.

(56) References Cited

U.S. PATENT DOCUMENTS

| | | |
|---|---|---|
| 9,865,649 B2 | 1/2018 | Tan et al. |
| 10,060,880 B2 | 8/2018 | Chen et al. |
| 2010/0181633 A1* | 7/2010 | Nam .................. H01F 10/3268 257/421 |
| 2016/0093670 A1* | 3/2016 | Jiang ...................... H01L 43/02 438/3 |
| 2017/0092693 A1* | 3/2017 | Tan ......................... H01L 43/08 |

* cited by examiner

*Primary Examiner* — Cuong B Nguyen
(74) *Attorney, Agent, or Firm* — Saile Ackerman LLC; Stephen B. Ackerman; Rosemary L. S. Pike

(57) ABSTRACT

A complementary metal oxide semiconductor (CMOS) device comprises a first metal line, a first metal via on the first metal line, a magnetic tunneling junction (MTJ) device on the first metal via wherein the first metal via acts as a bottom electrode for the MTJ device, a second metal via on the MTJ device, and a second metal line on the second metal via.

13 Claims, 1 Drawing Sheet

METHOD TO INTEGRATE MRAM DEVICES TO THE INTERCONNECTS OF 30NM AND BEYOND CMOS TECHNOLOGIES

TECHNICAL FIELD

This application relates to the general field of magnetic tunneling junctions (MTJ) and, more particularly, to methods for improving the process margin and enhancing device performance in the fabrication of MTJ structures.

BACKGROUND

Fabrication of embedded magnetoresistive random-access memory (MRAM) devices normally involves forming MTJ patterns between two layers of metal lines, connected through two later formed vias serving as top and bottom electrodes of the MTJ. However, the vertical spacing between two metal lines (including the via in between) for the sub-30 nm CMOS technology is usually less than 150 nm and the height for the via alone, which represents the real spacing for MRAM integration, is less than 75 nm. This means that without changing the thickness of the MTJ's essential parts (cap layer, free layer, tunnel barrier, pinned layer and seed layer), which is usually 20-30 nm, one has to limit the total thickness of the MTJ's metal hard mask and top and bottom electrodes to 45-55 nm. This would greatly reduce the later process margin such as MTJ etch and CMP. For instance, the bottom electrode is preferred to be smaller or the same size as the MTJ, so that during the MTJ over etch, especially by physical etch, the metal re-deposition from the vias as well as the MTJ itself can be minimized. However when the bottom electrode' height is too small, the allowed amount of MTJ over etch is limited, still leaving some metal re-deposition on the MTJ sidewall and shorting the devices. When it comes to thin a MTJ hard mask and/or top electrode, the later processes such as MTJ CMP might consume all of it, damaging the MTJ's top portion or all of the MTJ. A new integration scheme is needed to meet the future interconnect scaling challenge.

Several patents show MTJ's between metal lines, such as U.S. Pat. No. 9,865,649 (Tan et al). U.S. Pat. No. 10,060,880 (Chen et al) shows an MTJ between an underlying metal line and an overlying metal via. These devices are different from the present disclosure.

SUMMARY

It is a primary object of the present disclosure to provide a method of improving the process margin and enhancing device performance in the fabrication of MTJ structures.

Another object of the present disclosure is to provide a method of improving the process margin and enhancing device performance by fabricating MTJ structures between two layers of metal vias rather than between two layers of metal lines.

In accordance with the objectives of the present disclosure, a method for fabricating a magnetic tunneling junction (MTJ) structure is achieved. A first metal line is provided. A first metal via is formed on the first metal line. A MTJ stack is deposited on the first metal via wherein the first metal via acts as a bottom electrode for the MTJ stack. The MTJ stack not covered by a photoresist pattern is etched to form a MTJ structure. A dielectric layer is deposited encapsulating the MTJ structure. A second metal via is formed on the MTJ structure and a second metal line is formed contacting the second metal via.

Also in accordance with the objectives of the present disclosure, a complementary metal oxide semiconductor (CMOS) device is achieved comprising a first metal line, a first metal via on the first metal line, a magnetic tunneling junction (MTJ) device on the first metal via wherein the first metal via acts as a bottom electrode for the MTJ device, a second metal via on the MTJ device, and a second metal line on the second metal via.

BRIEF DESCRIPTION OF THE DRAWINGS

In the accompanying drawings forming a material part of this description, there is shown.

DETAILED DESCRIPTION

The present disclosure provides a method to integrate MRAM devices to their metal interconnects. More specifically, the MTJ is embedded between two layers of metal vias, instead of the most widely used approach of between two layers of metal lines. By fabricating the MRAM on the metal vias directly, there is no need to form additional bottom vias/electrodes connecting the metal lines underneath, effectively enhancing the later process margin and saving manufacturing cost. The smaller size of the vias as compared to the MTJ also allows for a great MTJ over etch to reduce the conductive metal re-deposition on the MTJ sidewalls, effectively eliminating electrically shorted devices.

Figure 1:
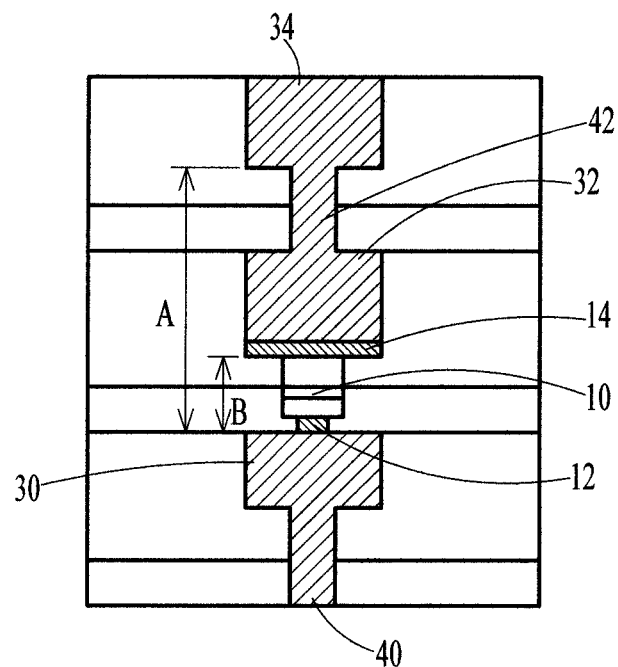
FIG. 1 illustrates in cross-sectional representation a MTJ of the prior art.

In the industry's standard process, as illustrated in FIG. 1, the MTJ 10 is embedded between two layers of metal lines 30 and 32, connected through two layers of later formed vias/electrodes 40 and 42 above and below the MTJ. However, the vertical spacing between two metal lines (including the via in between) A for the sub-30 nm CMOS technology is usually less than 150 nm and the height B for the via alone, which represents the real spacing for MRAM integration, is less than 75 nm. This means that without changing the thickness of the MTJ's essential parts 10 (cap layer, free layer, tunnel barrier, pinned layer and seed layer), which is usually 20-30 nm, one has to limit the total thickness of the MTJ's metal hard mask and top electrode 14 and bottom electrode 12 to 45-55 nm.

Figure 2:
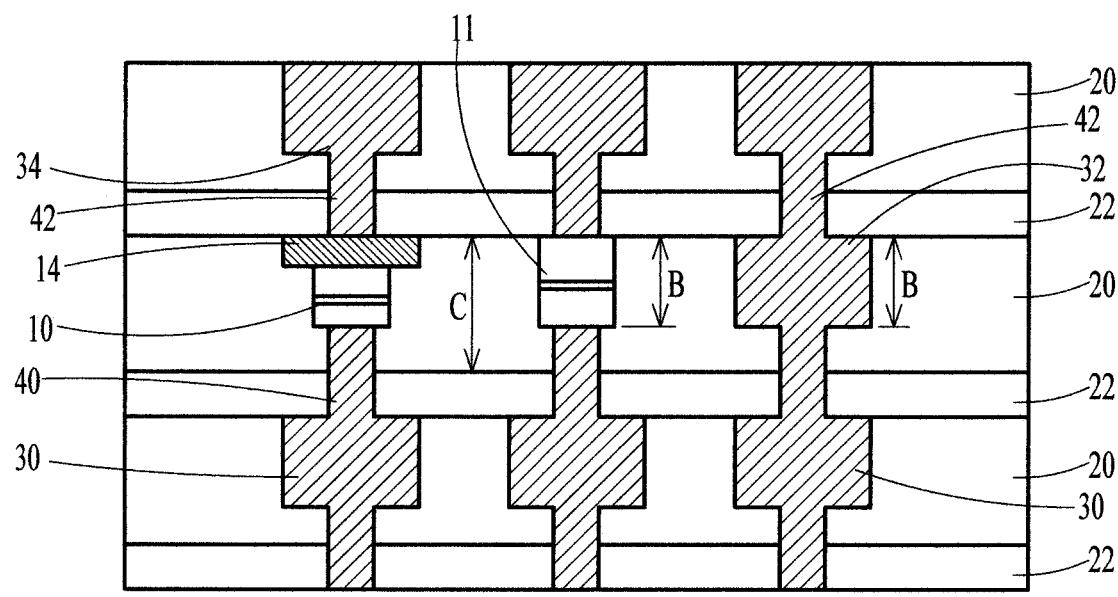
FIG. 2 illustrates in cross-sectional representation a MTJ in a preferred embodiment of the present disclosure.

In the process of the present disclosure, we build the MTJ between two layers of metal vias, from which the process margin, fabrication cost and device performance can be improved simultaneously. FIG. 2 illustrates MTJ's 10 formed between two layers of metal vias 40 and 42. By fabricating the MTJ on top of the metal vias directly, there is no need to form an additional bottom electrode connecting the metal lines 30 underneath, allowing for a thicker MTJ hard mask/top electrode 14 to increase the later process margin, as well as a manufacturing cost reduction. The smaller width of vias 40 than the MTJ 10 also allows for a great MTJ over etch to reduce the conductive metal re-deposition on the MTJ sidewall, effectively eliminating electrically shorted devices.

In the example of embedded MRAM devices between metal vias for 30 nm and beyond CMOS technologies, shown in FIG. 2, the interlayer dielectric (ILD) 20 thickness C is ~75 nm, for example, between etch stop layers 22. The real metal line-to-line or via-to-via spacing B is <75 nm; for example, ~50 nm. When the MTJ 10 is formed between two layers of metal vias 40 and 42, there is no need to form an additional bottom electrode, but the bottom via 40 is used as the bottom electrode. The MTJ is patterned to be equal to or larger than the bottom via in width. The top and bottom metal vias preferably have a width of about 10 to 50 nm and a height of about 10 to 75 nm.

After patterning the MTJ, one or more layers of dielectric 20 are deposited to encapsulate the MTJ. Preferably, the MTJ has a height of between about 20 and 30 nm. An additional top electrode 14, which is wider than the MTJ, can be formed between the MTJ and top vias 42. This additional top electrode can be added when the required height of the MTJ 10 is smaller than the via-to-via spacing B. The additional top electrode can improve the later process margin such as for chemical mechanical polishing (CMP). When the required MTJ height is equal to the allowed spacing B, (as shown for MTJ 11), one can build the MTJ directly connecting with the top via 42 as the top electrode instead. This means the total spacing for the MTJ and the optional top electrode is up to ~50 nm.

The bottom and top vias (40, 42) and optional top electrode can be made of metals such as Co, Cu, Mo, Rh, Ni, Ir, Ru, Al, TiN, TaN, or their alloys or Cu cladded with materials such as Co. Compared to the traditional way of forming MTJ's between two layers of metal lines, the MTJ hard mask and/or top electrode in the process of the present disclosure can therefore be thicker to enhance the later process margin. Since the vias 40 are narrower than the MTJ 10, after patterning the MTJ's, a great over etch of the MTJ's can be performed to reduce or completely remove any conductive metal re-deposition on the MTJ sidewalls, effectively eliminating electrically shorted devices.

The process of the present disclosure allows for a larger process margin, lower fabrication cost, and higher device performance for MRAM devices embedded to advanced nodes CMOS technologies, where the integration can be challenging due to the limited layer spacing. This new approach of forming MTJ's between vias can find particularly useful applications for 30 nm and beyond CMOS technologies, where the vertical spacing between two metal lines including the via in between is usually less than 150 nm and the real metal line-to-line or via-to-via spacing, which represents the spacing for MRAM integration, is less than 75 nm.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating a magnetic tunneling junction (MTJ) structure comprising:
   providing a plurality of first metal lines;
   forming a plurality of first metal vias on said first metal lines;
   depositing a MTJ stack on one of said first metal vias wherein said first metal via acts as a bottom electrode for said MTJ stack, wherein no additional bottom electrode is formed, and wherein said MTJ stack comprises at least a pinned layer, a barrier layer, and a free layer;
   etching said MTJ stack not covered by a photoresist pattern to form an MTJ structure wherein said MTJ structure has a horizontal width equal to or greater than a horizontal width of said first metal via;
   forming a plurality of second metal lines on other of said first metal vias;
   depositing a dielectric layer encapsulating said MTJ structure and said second metal lines; and
   forming a plurality of second metal vias on said MTJ structure and on said second metal lines;
   forming a plurality of third metal lines contacting said second metal vias wherein a first height of said MTJ structure measured from a top surface of an underlying said first metal via to a bottom surface of an overlying said second metal via is equal to a second height of a second metal line measured from an underlying said first metal via to an overlying said second metal via.

2. The method according to claim 1 wherein said first and second metal vias comprise Co, Cu, Mo, Rh, Ni, Ir, Ru, Al, TiN, TaN, or their alloys or Cu cladded with Co.

3. The method according to claim 1 wherein said first and second metal vias have a width of about 10 to 50 nm and a height of about 10 to 75 nm.

4. The method according to claim 1 further comprising over-etching said MTJ structure to remove any conductive metal re-deposition on sidewalls of said MTJ structure.

5. The method according to claim 1 further comprising forming a top electrode layer on said MTJ structure and wherein a third height of said MTJ structure plus said top electrode measured from a top surface of an underlying said first metal via to a bottom surface of an overlying said second metal via is equal to said second height of said second metal line.

6. The method according to claim 1 wherein said second metal via acts as a top electrode for said MTJ structure and no additional top electrode is formed and wherein said first height of said MTJ structure is equal to said second height of said second metal line.

7. The method according to claim 1 wherein said first height of said MTJ structure is between about 20 and 30 nm.

8. A complementary metal oxide semiconductor (CMOS) device comprising:
   a plurality of first metal lines;
   a plurality of first metal vias on said first metal lines;
   a magnetic tunneling junction (MTJ) structure on one of said first metal vias wherein said first metal via acts as a bottom electrode for said MTJ structure and there is no additional bottom electrode and wherein said MTJ structure has a horizontal width equal to or greater than a horizontal width of said first metal via;
   a plurality of second metal lines on other of said first metal vias;
   a plurality of second metal vias on said MTJ structure and on said second metal lines wherein a first height of said MTJ structure measured from a top surface of an underlying said first metal via to a bottom surface of an overlying said second metal via is equal to a second height of said second metal line measured from an underlying said first metal via to an overlying said second metal via; and
   a plurality of third metal lines on said second metal vias.

9. The device according to claim 8 wherein said first and second metal vias comprise Co, Cu, Mo, Rh, Ni, Ir, Ru, Al, TiN, TaN, or their alloys or Cu cladded with Co.

10. The device according to claim 8 wherein said first and second metal vias have a width of about 10 to 50 nm and a height of about 10 to 75 nm.

11. The device according to claim 8 further comprising a top electrode on said MTJ structure wherein said second metal via contacts said top electrode and wherein a third height of said MTJ structure plus said top electrode measured from a top surface of an underlying said first metal via to a bottom surface of an overlying said second metal via is equal to said second height of said second metal line.

12. The device according to claim 8 wherein said second metal via acts as a top electrode for said MTJ structure and there is no additional top electrode and wherein said first height of said MTJ structure is equal to said second height of said second metal line.

13. The device according to claim 8 wherein said first height of said MTJ structure is between about 20 and 30 nm.

* * * * *